US006552416B1

(12) United States Patent
Foster

(10) Patent No.: US 6,552,416 B1
(45) Date of Patent: Apr. 22, 2003

(54) MULTIPLE DIE LEAD FRAME PACKAGE WITH ENHANCED DIE-TO-DIE INTERCONNECT ROUTING USING INTERNAL LEAD TRACE WIRING

(75) Inventor: Donald C. Foster, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/659,017

(22) Filed: Sep. 8, 2000

(51) Int. Cl.$^7$ .............................................. H01L 23/495
(52) U.S. Cl. ...................... 257/666; 257/676; 257/723
(58) Field of Search ................................ 257/666, 676, 257/669, 690, 723

(56) References Cited

U.S. PATENT DOCUMENTS

| | | | |
|---|---|---|---|
| 3,851,221 A | 11/1974 | Beaulieu et al. ............. 317/100 |
| 4,567,643 A | 2/1986 | Droguet et al. ................ 29/575 |
| 4,730,232 A | 3/1988 | Lindberg ..................... 361/381 |
| 4,763,188 A | 8/1988 | Johnson ....................... 357/74 |
| 4,982,265 A | 1/1991 | Watanabe et al. ............. 357/75 |
| 4,996,587 A | 2/1991 | Hinrichsmeyer et al. ...... 357/74 |
| 5,012,323 A | 4/1991 | Farnworth .................... 357/75 |
| 5,025,306 A | 6/1991 | Johnson et al. ............... 357/75 |
| 5,040,052 A | 8/1991 | McDavid ...................... 357/80 |
| 5,138,438 A | 8/1992 | Masayuki et al. ............. 357/75 |
| 5,140,404 A | 8/1992 | Fogal et al. ................... 357/70 |
| 5,165,067 A | 11/1992 | Wakefiled et al. ........... 257/780 |
| 5,198,888 A | 3/1993 | Sugano et al. ............... 257/686 |
| 5,229,647 A | 7/1993 | Gnadinger ................... 257/785 |
| 5,245,215 A * | 9/1993 | Sawaya ....................... 257/723 |
| 5,291,061 A | 3/1994 | Ball ............................ 257/686 |
| 5,323,060 A | 6/1994 | Fogal et al. ................. 257/777 |
| 5,332,864 A | 7/1994 | Liang et al. ................ 174/52.4 |

(List continued on next page.)

FOREIGN PATENT DOCUMENTS

| | | | |
|---|---|---|---|
| EP | 503 201 A2 | 12/1991 | ......... H01L/23/495 |
| JP | 54-128274 | 4/1979 | .......... H01L/23/30 |
| JP | 56062351 | 5/1981 | .......... H01L/25/04 |
| JP | 60182731 | 9/1985 | .......... H01L/21/60 |
| JP | 61059862 | 3/1986 | .......... H01L/25/04 |
| JP | 61117858 | 6/1986 | .......... H01L/25/08 |
| JP | 62119952 | 6/1987 | .......... H01L/25/04 |
| JP | 62-126661 | 6/1987 | .......... H01L/25/04 |
| JP | 62142341 | 6/1987 | .......... H01L/25/04 |
| JP | 63211663 | 9/1988 | .......... H01L/25/08 |
| JP | 63-244654 | 10/1988 | .......... H01L/23/28 |
| JP | 1028856 | 1/1989 | .......... H01L/27/00 |
| JP | 64001269 | 1/1989 | .......... H01L/25/04 |
| JP | 1071162 A | 3/1989 | .......... H01L/23/52 |
| JP | 1099248 A | 4/1989 | .......... H01L/25/08 |
| JP | 3169062 | 7/1991 | ......... H01L/25/065 |
| JP | 4028260 | 1/1992 | ......... H01L/25/065 |

(List continued on next page.)

*Primary Examiner*—Roy Potter
(74) *Attorney, Agent, or Firm*—Skjerven Morrill LLP; James E. Parsons

(57) ABSTRACT

A multiple die package is formed, which allows multiple die to be interconnected using internal leads or traces from a lead frame. A plurality of slots in the paddle area of the lead frame are created which define the internal signal traces. Then the outer portions of the die paddle area of the lead frame are removed or trimmed to isolate the internal traces from each other and form a plurality of individual internal leads. Multiple die, either stacked, in a planar array, or a combination of the two, are connected to selected internal leads, such as by wire bonding, to form the desired die-to-die interconnections for routing signals between die without interfering with normal wire bond fan-out. A tape can be adhered to the interior portion of the die paddle area prior to trimming to hold the internal traces in place and leave the ends of the traces exposed for wire bonding to the die. The internal traces also allow connections to be made within a single die by wire bonding selected bond pads from the die via one or more of the internal traces.

41 Claims, 6 Drawing Sheets

U.S. PATENT DOCUMENTS

| | | | | |
|---|---|---|---|---|
| 5,334,875 A | 8/1994 | Sugano et al. | ............... | 257/686 |
| 5,347,429 A | 9/1994 | Kohno et al. | ............... | 361/813 |
| 5,422,435 A | 6/1995 | Takiar et al. | ............... | 174/52.4 |
| 5,426,563 A | 6/1995 | Moresco et al. | ............ | 361/689 |
| 5,432,729 A | 7/1995 | Carson et al. | ................. | 365/63 |
| 5,455,387 A | 10/1995 | Hoffman et al. | ............ | 174/52.4 |
| 5,462,624 A | 10/1995 | Kwon | ........................ | 156/257 |
| 5,463,253 A | 10/1995 | Waki et al. | .................. | 257/724 |
| 5,473,196 A | 12/1995 | De Givry | .................... | 257/786 |
| 5,495,394 A | 2/1996 | Kornfeld et al. | ............ | 361/764 |
| 5,495,398 A | 2/1996 | Takiar et al. | ................ | 361/790 |
| 5,502,289 A | 3/1996 | Takiar et al. | ................ | 174/266 |
| 5,514,907 A | 5/1996 | Moshayedi | .................. | 257/723 |
| 5,569,625 A | 10/1996 | Yoneda et al. | ................ | 29/827 |
| 5,581,498 A | 12/1996 | Ludwig et al. | ................ | 365/63 |
| 5,587,341 A | 12/1996 | Masayuki et al. | ........... | 437/206 |
| 5,614,766 A | 3/1997 | Takasu et al. | ............... | 257/777 |
| 5,637,536 A | 6/1997 | Val | .............................. | 438/686 |
| 5,637,912 A | 6/1997 | Cockerill et al. | ........... | 257/620 |
| 5,682,062 A | 10/1997 | Gaul | ............................ | 257/686 |
| 5,689,135 A | 11/1997 | Ball | ............................ | 257/686 |
| 5,696,031 A | 12/1997 | Wark | .......................... | 437/209 |
| 5,715,147 A | 2/1998 | Nagano | ........................ | 361/813 |
| 5,721,452 A | 2/1998 | Fogal et al. | .................. | 257/685 |
| 5,739,581 A | 4/1998 | Chillara et al. | ............. | 257/668 |
| 5,780,925 A * | 7/1998 | Cipolla et al. | ............... | 257/777 |
| 5,783,870 A | 7/1998 | Mostafazadeh et al. | ..... | 257/791 |
| 5,793,108 A | 8/1998 | Nakanishi et al. | .......... | 257/723 |
| 5,798,014 A | 8/1998 | Weber | ........................ | 156/263 |
| 5,815,372 A | 9/1998 | Gallas | ........................ | 361/760 |
| 5,861,666 A | 1/1999 | Bellaar | ....................... | 257/686 |
| 5,872,025 A | 2/1999 | Cronin et al. | ................ | 438/109 |
| 5,885,849 A | 3/1999 | DiStefano et al. | ........... | 438/108 |
| 5,886,412 A | 3/1999 | Fogal et al. | ................. | 257/777 |
| 5,898,220 A | 4/1999 | Ball | ........................... | 257/723 |
| 5,917,242 A | 6/1999 | Ball | ........................... | 257/737 |
| 5,952,611 A | 9/1999 | Eng et al. | .................. | 174/52.4 |
| 5,973,403 A | 10/1999 | Wark | .......................... | 257/777 |
| 6,005,778 A | 12/1999 | Spielberger et al. | ........ | 361/770 |
| RE36,613 E | 3/2000 | Ball | ........................... | 257/777 |
| 6,051,886 A | 4/2000 | Fogal et al. | ................. | 257/777 |
| 6,057,598 A | 5/2000 | Payne et al. | ................. | 257/723 |
| 6,072,243 A | 6/2000 | Nakanishi | .................... | 257/783 |
| 6,080,264 A | 6/2000 | Ball | ........................... | 156/292 |
| 6,133,637 A * | 10/2000 | Hikita et al. | ................. | 257/777 |
| 6,184,463 B1 | 2/2001 | Panchou et al. | ............ | 174/52.4 |
| 6,214,641 B1 | 4/2001 | Akram et al. | ................ | 438/107 |
| 6,225,146 B1 * | 5/2001 | Yamaguchi et al. | ........ | 438/123 |
| 6,235,554 B1 | 5/2001 | Akram et al. | ................ | 438/109 |
| 6,255,146 B1 | 5/2001 | Yamaguchi et al. | ........ | 438/123 |
| 6,313,527 B1 * | 11/2001 | Han et al. | ................... | 257/723 |

FOREIGN PATENT DOCUMENTS

| | | | | |
|---|---|---|---|---|
| JP | 4-56262 | 2/1992 | ........... | H01L/25/65 |
| JP | 4096358 | 3/1992 | ......... | H01L/25/065 |
| JP | 4116859 | 4/1992 | ......... | H01L/25/065 |
| JP | 4-368154 A | 12/1992 | ........... | H01L/23/00 |
| JP | 4-368167 | 12/1992 | ......... | H01L/25/065 |
| JP | 5013665 | 1/1993 | ......... | H01L/25/065 |
| JP | 5-75015 A | 3/1993 | ......... | H01L/25/065 |
| JP | 5109975 | 4/1993 | ......... | H01L/25/065 |
| JP | 5136323 | 6/1993 | ........... | H01L/23/52 |
| JP | 5-283601 | 10/1993 | ........... | H01L/23/52 |
| JP | 63128736 | 6/1998 | ........... | H01L/23/04 |
| JP | 10-256470 | 9/1998 | ......... | H01L/25/065 |

\* cited by examiner

MULTIPLE DIE LEAD FRAME PACKAGE WITH ENHANCED DIE-TO-DIE INTERCONNECT ROUTING USING INTERNAL LEAD TRACE WIRING

BACKGROUND

1. Field of Invention

The present invention relates to integrated circuit packaging, and more particularly to multiple die packaging.

2. Related Art

Semiconductor die or chip packages are used to protect the semiconductor device (e.g., an integrated circuit chip) and allow the chip to be electrically connected to external circuitry. The chip typically has a surface containing active circuit elements that can be accessed via conductors on the chip, such as bonding pads. The chip can be packaged using numerous packaging techniques, as is known in the art. The package can then be placed into a printed circuit board (PCB) to access the circuitry on the IC chip.

As the complexity of applications increases, a greater number of chips are needed on the PCB to implement the necessary functions. Conventional methods to increase the number of chips without increasing the package size is to stack multiple chips on the package, such as disclosed in U.S. Pat. No. 5,012,323 to Farnworth, U.S. Pat. No. 5,291,061 to Ball, U.S. Pat. No. 5,347,429 to Kohno et al., U.S. Pat. No. 5,780,925 to Cipolla et al., U.S. Pat. No. 5,793,108 to Nakanishi et al., and U.S. Pat. No. 5,898,220 to Ball. Although these disclose two or more stacked die each electrically connected to leads on the package or lead frame, none disclose the ability to connect the die together without connection to the external package leads, which limits the interconnection capability of signals between die, such as the wire bond fan-out of the package.

In order to increase signal routing capability, previous solutions included using higher cost laminate-based packages. Thus, it is desirable to have a stacked multiple-die package with high signal routing capability between die without the costs associated with laminate-based packages.

SUMMARY

In the present invention, a method and structure are provided that allow multiple stacked die to be connected through internal conductive traces in the lead frame or package for high signal routing capability between die.

According to the present invention, electrically isolated signal traces within the paddle area are created for die-to-die signal interconnection and held together using lead lock tape. These signal traces are completely internal to the package and not connected to the external leads. Die are then stacked, either over each other or on both sides of the paddle area, and interconnected via the internal traces. A bond wire is connected from a bond pad of a first die to an internal trace. Another bond wire is connected from a bond pad of a second die to the internal trace to provide a desired interconnection between the two die.

This invention takes advantage of the metal in the lead frame paddle area to create internal "inner" lead traces (ILTs) for signal routing for die-to-die interconnection in stacked die lead frame packages. The "inner" leads complement the existing "outer" leads normally associated with lead frame design, which are used to provide electrical connection between the die and peripheral circuitry.

In one set of embodiments, a first die is mounted over the ILTs, such as with die attach paste or adhesive film, and a second die is mounted over the first die, such as with die attach paste or film adhesive. The first die and ILT area are designed such that there must be sufficient separation between the ILT area and the first die to allow wire connection to the ILTs. There must also be sufficient separation between the first and second die to allow wire connection to the bond pads from the first die.

In another set of embodiments, a first die is mounted over one side of the ILTs, and a second die is mounted on the other side of the ILTs, either with the active side (having the bond pads) or the inactive "back" side facing the ILT paddle area. If the second die is mounted with the active side facing the ILT paddle area, there must be sufficient separation between the top of the die the bottom of the ILT paddle area to allow proper wire connection to bond pads on the second die. If the first die is at least the same size as the ILT paddle area, the separation between the first die and the ILTs must be adequate to allow bond wire connection to the ILTs. This set of embodiments also allows a second die with center bond pads to be connected to the first die. The bond pads of the second die, mounted with the active side facing the ILTs, are connected to center portions of the ILTs, while the bond pads of the first die are connected to outer portions of the ILTs to facilitate the desired signal routing.

In other embodiments, the present invention provides additional benefits, such as allowing a larger lower die to be connected to external fingers of a lead frame while allowing the smaller upper die to be connected to ILTs without bond wires crossing each other. The ILT paddle area leads can be designed such that the ILT fingers extend beyond the tips of the external fingers in a interleaved fashion, i.e., the ends of the external fingers are closer to the die than the ends of the ILTs. With this configuration, a larger bottom die mounted on the ILT paddle area can be wire bonded to the external fingers, while a smaller top die mounted over the larger die can be wire bonded to the ILTs without crossing the bond wires of the top and bottom die.

Using conventional wire bonding techniques, the equivalent of a "via" can also be formed. Wire bonds are used to provide the out-of-plane electrical connections between crossing ILT segments of a specific die-to-die signal path. This allows routing of crossed die-to-die signal paths, similar to the way "vias" are used in multi-layer laminate substrates. These wire bond "vias" also overcome the inherent limitation of one-dimensional, or single metal layer, routing limitations of a lead frame.

The present invention will be more fully understood when taken in light of the following detailed description taken together with the accompanying drawings.

BRIEF DESCRIPTION OF THE DRAWINGS

FIGS. 9A, 9B, and 9C show another embodiment of the present invention, in which wire bond vias are used to route crossed signal path ILT segments.

Use of the same or similar reference numbers in different figures indicates same or like elements.

DETAILED DESCRIPTION OF THE PREFERRED EMBODIMENTS

The present invention provides a method and structure to allow inexpensive signal routing between stacked die in a lead frame by forming inexpensive interconnections between die using inner lead traces (ILTs) formed etching or stamping signal trace defining slots, then trimming the edge of the ILT paddle area to create electrically isolated traces.

Figure 1:
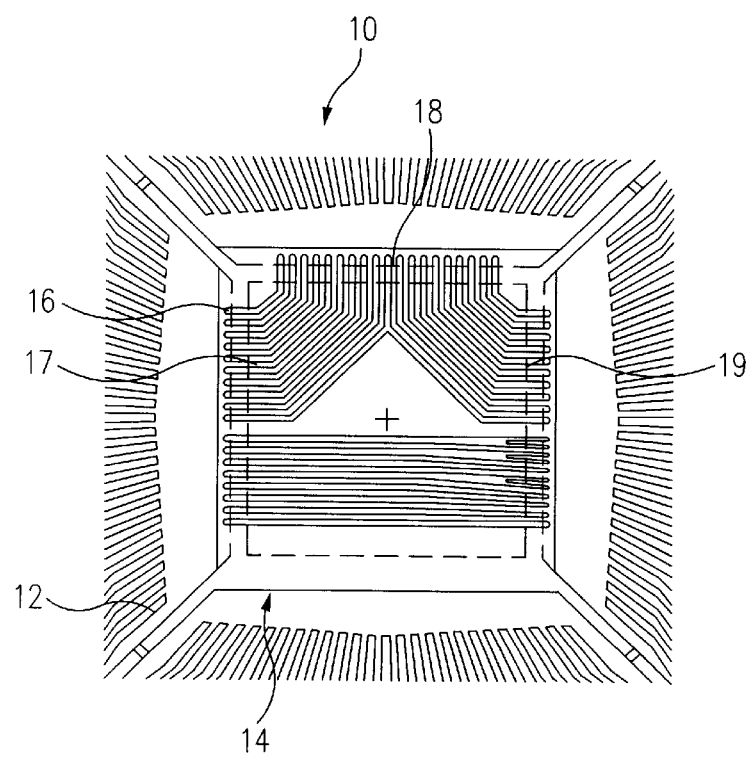
FIG. 1 is a top view of a lead frame package for use in one embodiment of the present invention.

FIG. 1 is a top view of an ILT lead frame package 10, according to one embodiment, having a plurality of external lead fingers or outer lead traces (OLTs) 12 and an internal paddle area 14 containing slots 16 and traces 17, where traces 17 are electrically connected. Lead frame package 10 is shown having slots 16 ending at three sides of the package. However, the lead frame package can be any suitable type, such as dual-sided or quad packages.

According to the present invention, the outer portions of paddle area 14 are removed or trimmed to create inner lead traces (ILTs) for die interconnection. In FIG. 1, dotted line 18 shows, for example, portions of paddle area 14 to be removed, such by trimming or cutting. Prior to removing the outer portions, a tape, such as a standard lead locking tape, is placed over an interior portion on either side of paddle area 14, such as shown by dotted line 19. The tape may also serve as a permanent plating mask for plating the tips of the ILTs.

Figure 2:
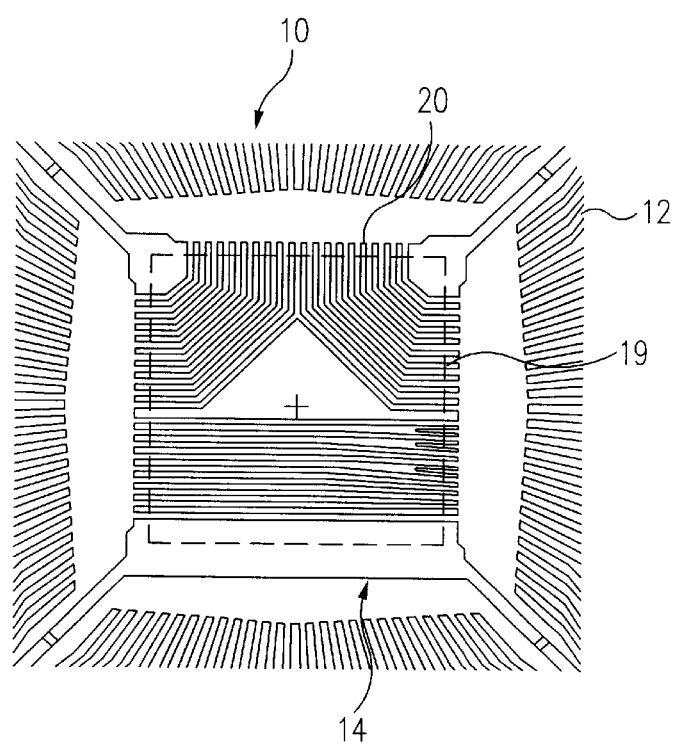
FIG. 2 shows a lead frame package formed from the package of FIG. 1 according to one embodiment of the present invention.

FIG. 2 shows lead frame package 10 after removal of the outer portions of paddle area 14. Traces 17 are no longer electrically connected to other traces. Instead, each resulting inner lead trace 20 is electrically isolated from other ILTs 20. As shown in FIG. 2, ILTs 20 can carry signals to and from adjacent sides or to and from opposite sides of paddle area 14. It should be noted that the package shown in FIG. 2 can be modified so that ILTs 20 can carry signals to and from the perimeter and the interior of paddle area 14 for die with center bond pads. To achieve this, an interior portion of paddle area 14 is removed, such that ILTs 20 have ends at the perimeter and interior of paddle area 14. This is in contrast to package 10 of FIG. 2, in which ILTs 20 have ends only at the perimeter of the paddle area. Die can then be attached and stacked onto package 10. Subsequent wire bonding electrically couples the die to OLTs 12 for connection to other circuitry, such as through a PCB. Wire bonding also electrically couples the stacked die to provide the desired signal routing or interconnections between the die.

Figure 3A:
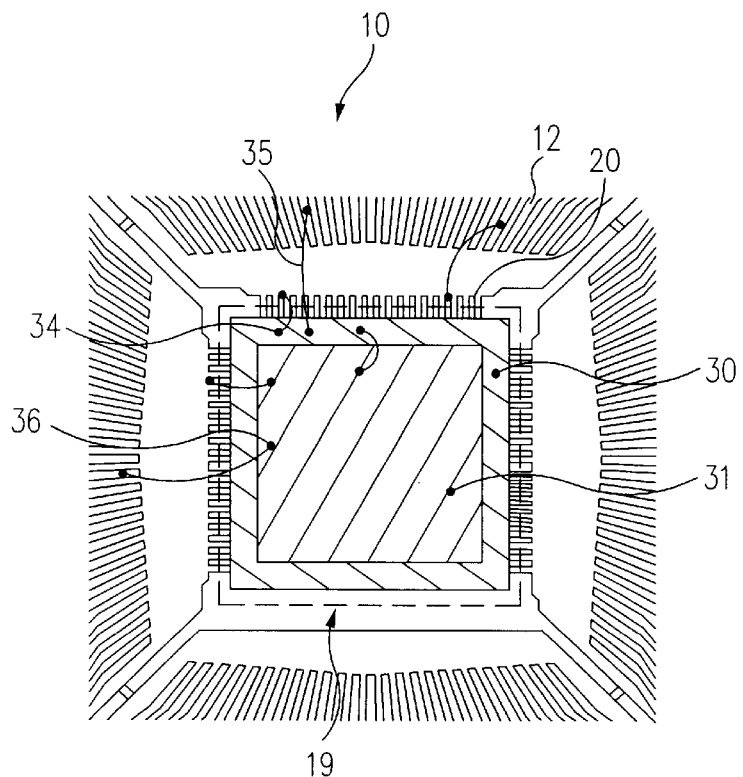
FIGS. 3A and 3B are respective top and side views of a lead frame package with stacked die according to one embodiment.
Figure 3B:
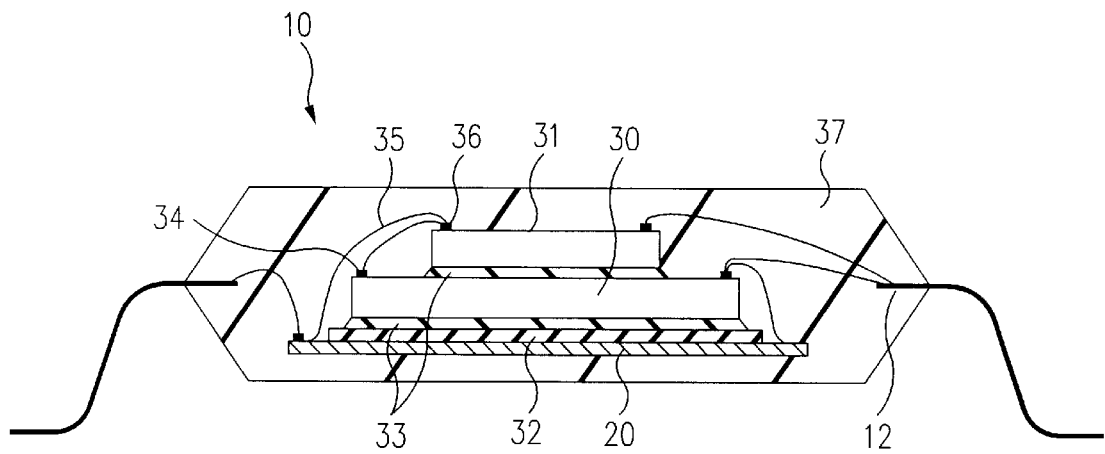

FIGS. 3A and 3B are respective top and side views of lead frame package 10 with a first die 30 and a second die 31. Note that these and other figures show only two die. However, as those skilled in the art will appreciate, more than two die can be used with the present invention. First die 30 is secured to an inner lead trace (ILT) tape 32, such as a standard lead locking tape discussed above, by a non-conductive film or a less expensive die attach paste 33. Note that tape 32 may also be placed on the bottom of ILT 20 with first die 30 secured directly to ILT 20 using non-conductive film or paste 33. In this embodiment, first die 30 is smaller than the ILT area so that the ends of ILTs 20 are exposed for wire bonding. Second die 31 is mounted to first die 30, such as with die attach paste 33. In this embodiment, second die 31 is smaller than first die 30 to allow wire bonding to bond pads 34 on first die 30. Thin conductive bond wires 35, such as gold, can be connected between bond pads 36 of second die 31 and selected ones of ILTs 20. Bond wires 35 can also be connected between bond pads 34 of first die 30 and the same selected ones of ILTs 20 to provide the desired die-to-die interconnection. In addition, bond wires 35 can be connected between bond pads 36 of second die 31 and OLTs 12, ILTs 20, or bond pads 34 of first die 30, between bond pads 34 of first die 30 and OLTs 12 or ILTs 20, and between OLTs 12 and ILTs 20. Using various combinations of these connections paths allows desired die-to-OLT connections and die-to-die interconnections to be formed, after which, the package can be encased, such as in a mold compound 37.

Figure 4:
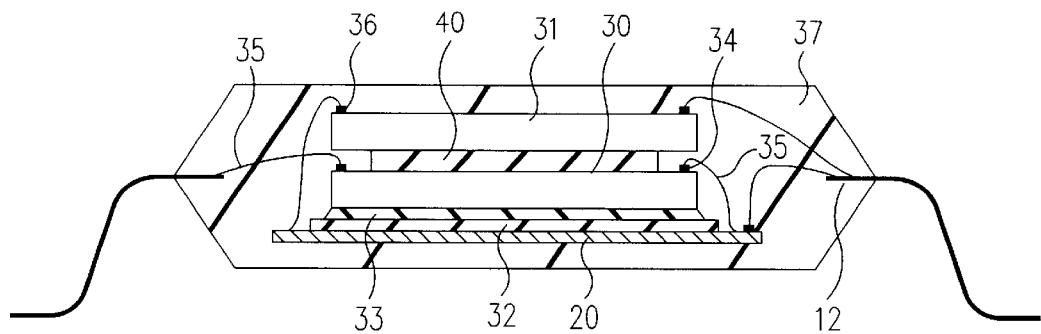
FIGS. 4 and 5 are side views of additional embodiments of the package shown in FIGS. 3A and 3B, in which the first and second die are on the same side of the internal traces.
Figure 5:
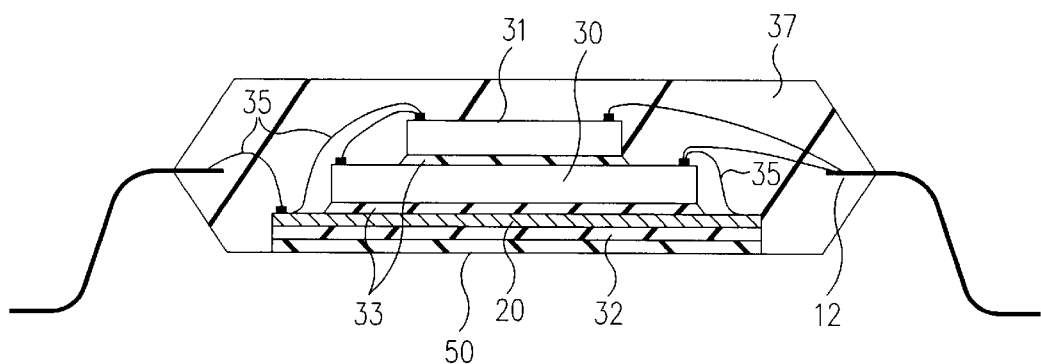

FIGS. 4 and 5 show some alternative embodiments to the package shown in FIGS. 3A and 3B, in which both die are stacked on one side of the ILTs. In FIG. 4, second die 31 is approximately the same size as first die 30, although second die 31 can also be larger. In this embodiment, after first die 30 is mounted over ILTs 20, such as by ILT tape 32 and die attach paste 33, bond wires are attached to bond pads 34 of first die 30. Second die 31 is then attached to first die 30 with a spacer 40, such as a thick non-conductive adhesive or die attach tape or a solid spacer attached to the two die by adhesive. If a solid spacer is used, the solid spacer can be made of a conductive material, such as a metal, or a non-conductive material, such as a polymer or ceramic. Further, the adhesive between the solid spacer and the top or active side of the die is non-conductive, while the adhesive between the solid spacer and the bottom or inactive side of the die can be conductive or non-conductive, depending on the electrical function, such as described in commonly-owned U.S. patent application Ser. No. 09/828,396, entitled "Making Semiconductor Devices Having Stacked Dies With Biased Back Surfaces", now U.S. Pat. No. 6,437,449, issued Aug. 20, 2002, which is incorporated by reference in its entirety. Spacer 40 should provide enough separation between first die 30 and second die 31 to allow clearance of bond wires 35 from bond pads 34.

In FIG. 5, an exposed thermal pad 50 is attached underneath ILTs 20 by ILT tape 32 or adhesive. In this embodiment, ILT tape 32 may or may not also be attached to the other side of ILTs 20 (FIG. 5 shows no ILT tape 32). Thermal pad 50 is exposed to the exterior of the package to provide a solderable thermal path. In other embodiments, a heat slug or other similar element can be used instead of thermal pad 50.

Figure 6:
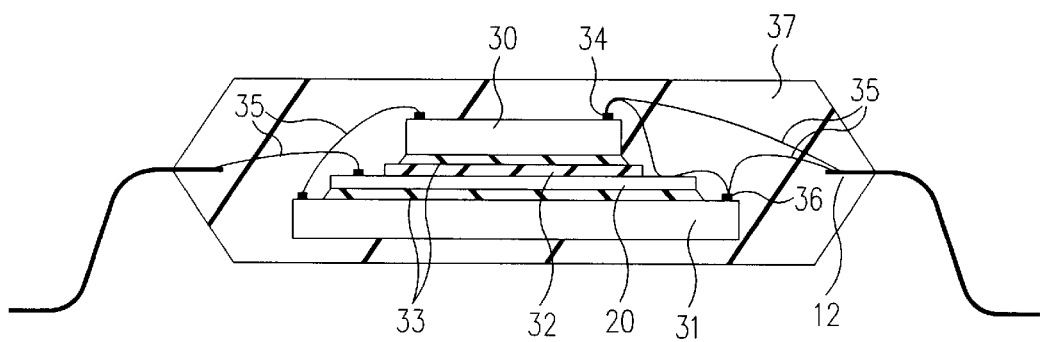
FIGS. 6, 7, and 8 are side views of different embodiments of the present invention, in which the first and second die are mounted on opposite sides of the internal traces.
Figure 7:
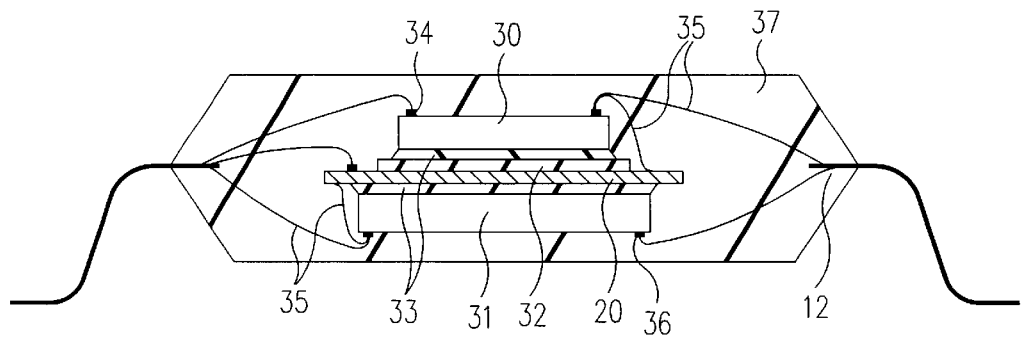
Figure 8:
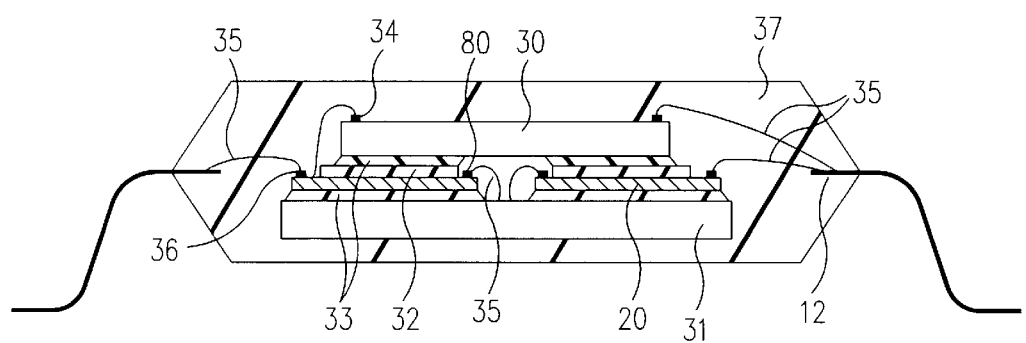

In other embodiments, shown in FIGS. 6, 7, and 8, first die 30 and second die 31 are on opposite sides of ILTs 20, instead of on the same side, as discussed above. In FIG. 6, the side of second die 31 containing active circuitry and bond pads is attached to the side of ILTs 20 opposite first die 30. Non-conductive die attach paste 33 or adhesive film secures second die 31 to ILTs 20. Also note that ILT tape 32 may be placed on top, bottom, or both sides of ILTs 20. As shown in FIG. 6, second die 31 is larger than the ILT area, which allows wire bonding to bond pads 36 of second die 31. First die 30 can also be the same size as or larger than the ILT area. In this case, there must be sufficient separation between the ILT area and first die 30 to allow wire bonding to the ILTs. After bond wires 35 are connected to bond pads 36 of second die 31, a spacer such as thick non-conductive paste or a solid spacer with adhesive, as discussed above, provides the desired separation and attachment between first die 30 and ILTs 20. Other variations of the package shown in FIG. 6 include features discussed above, such as first die 30 being larger than the ILT area and having an exposed thermal pad or heat slug attached to second die 31.

In FIG. 7, the inactive side of second die 31 is attached to ILTs 20. Adhesive 33 attaching second die 31 to ILTs 20 can be conductive or non-conductive. When electrical backside contact to first die 30 or second die 31 is desired, ILT tape 32 between the corresponding die and ILT 20 has openings to the appropriate electrical conductors so that electrical contact to the die backside may be made through the conductive adhesive. This may be done with one or both die. The bond fingers of ILTs 20 are plated on both sides to allow wire bonding from both die. Again, other variations are possible, such as first die 30 being the same size as or larger than the ILT area and/or the package having an exposed thermal pad or heat slug.

In FIG. 8, second die 31 has center bond pads 80 in addition to outer bond pads 36. The paddle area is formed, as discussed above, with ILTs 20 having terminals at both the perimeter and interior of the paddle area. Second die 31 is attached to ILTs 20, such as described above. Bond wires 35 are attached to outer bond pads 36 and center bond pads 80 as required. First die 30 is then attached to ILTs 20, again as discussed above, and wire bonded.

Figure 9A:
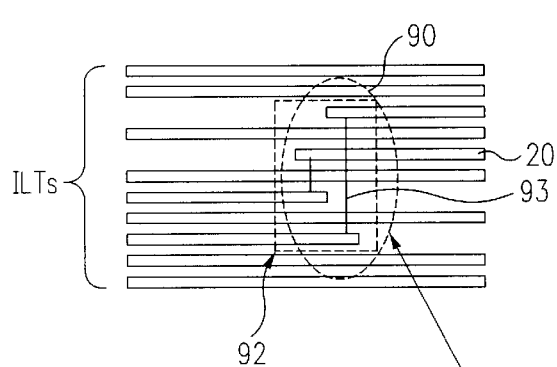
Figure 9A:
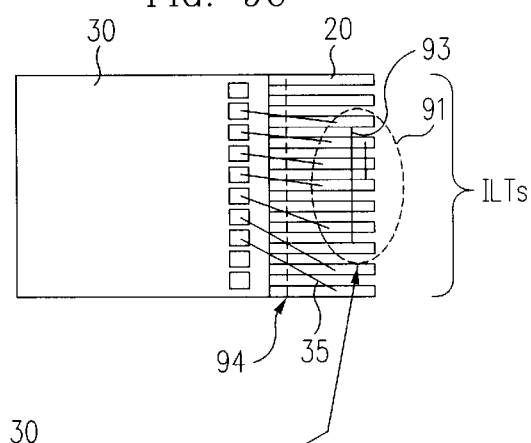
Figure 9A:
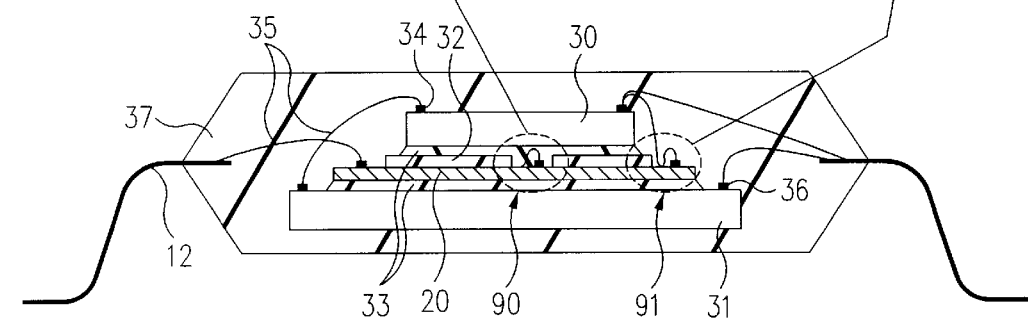

FIGS. 9A, 9B, and 9C show another embodiment of the present invention, which can be applied to any of the previous embodiments. This shows how crossed signal paths within the ILT can be used to route signals between die using wire bonds or allow signals to be routed within the same die, both of which are functionally similar to vias. FIG. 9A shows a package where these vias can be formed both at the interior of the paddle area at region 90 and at the exterior of the paddle area at region 91. FIG. 9B shows a top view of ILTs 20 at interior region 90. Dotted line 92 shows an opening in the ILT tape 32 to expose portions of ILTs 20 for connection. As seen, selected segments of ILTs 20 can be electrically connected by wires 93, providing electrically isolated but crossed signal paths between die, or a die may be wire bonded to one or more of the ILTs 20 to provide the desired connection between different portions of the die. FIG. 9C shows a top view of ILTs 20 at exterior region 91. The right of dotted line 94 are exposed portions of ILTs 20 not covered with the ILT tape 32. Similar to FIG. 9B, selected segments of ILTs 20 are wire bonded together, thereby providing a desired interconnection between die or within a die.

Figure 10A:
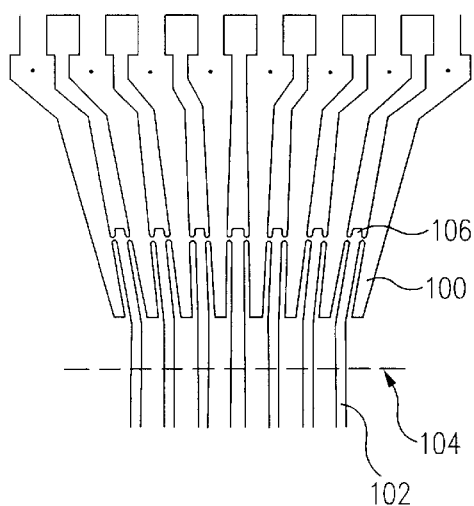
FIGS. 10A, 10B, and 10C show an embodiment of the present invention for wire bonding die to internal and external traces traces using interleaved bond fingers.
Figure 10B:
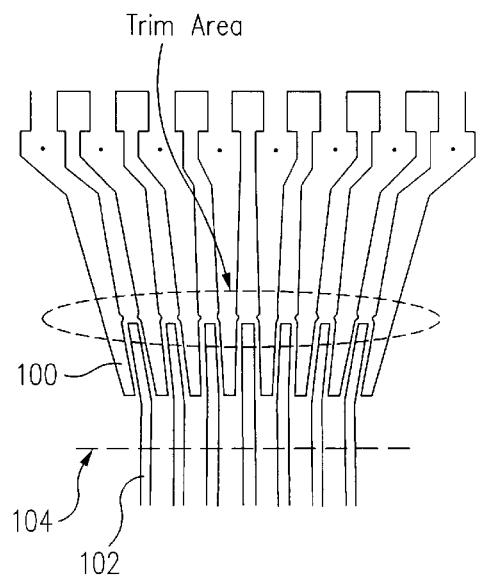
Figure 10C:
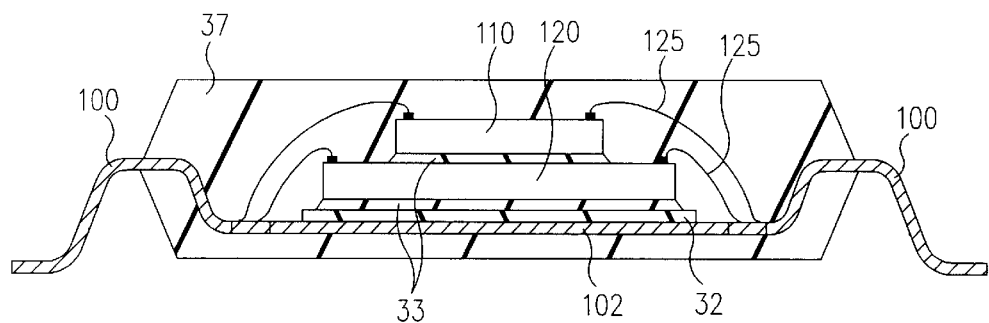

FIGS. 10A, 10B, and 10C show an embodiment of the present invention that allows a smaller upper die to be wire bonded to internal lead traces and a larger lower die to be wire bonded to outer or external leads without crossing upper and lower bond wires. FIG. 10A shows a portion of a lead frame package having external leads 100 and internal leads 102. Internal leads 102 are exposed above dotted line 104, underneath which indicates the ILT tape 32. As seen from FIG. 10A, external leads 100 and internal leads 102 are electrically connected at portions 106 prior to trimming to allow a conventional lead frame manufacturing process. FIG. 10B shows the portion of the lead frame of FIG. 10A after trimming away portions 106, resulting in electrical isolation of interleaved external leads 100 and internal leads 102. The ends of internal leads 102 extend beyond the ends of external leads 100, which are now closer to the die. This allows a smaller upper die 110 to be wire bonded to the internal leads and a larger lower die 120 to be wire bonded to the external leads without crossing bond wires 125, as shown in FIG. 10C.

The above-described embodiments of the present invention are merely meant to be illustrative and not limiting. It will thus be obvious to those skilled in the art that various changes and modifications may be made without departing from this invention in its broader aspects. For example, the above specification describes multiple die counted on a lead frame with lead fingers for connection to PCBs. However, other types of lead frames are also suitable for use with the present invention, such as micro lead frames, which have leads in the form of lands on the bottom surface of the package. Further, stacked-die packages are shown, although other types of arrangements are also suitable, such as multi-die single layer configurations or a combination of both. Therefore, the appended claims encompass all such changes and modifications as fall within the true spirit and scope of this invention.

What is claimed is:

1. A semiconductor die package, comprising:
   a plurality of conductive outer leads having a first set of ends extending toward an interior of the package;
   a plurality of conductive inner leads, each of the inner leads electrically isolated from each other and from the outer leads, wherein each of the inner leads has at least a first and a second end, with at least the first end extending toward an exterior of the package;
   a first die coupled to one side of the inner leads; and
   a second die coupled over the first die, wherein the first die is electrically coupled to the second die through at least one of the inner leads.

2. The package of claim 1, wherein the second die is smaller than the first die.

3. The package of claim 1, wherein the first die is smaller than a perimeter of the inner leads.

4. The package of claim 1, wherein the second die is at least as large as the first die.

5. The package of claim 1, further comprising a first bond wire coupling the first die to one of the inner leads and a second bond wire coupling the second die to the same one of the inner leads.

6. The package of claim 1, wherein the first die and the second die are electrically coupled together by bond wires and at least one of the inner leads.

7. A semiconductor die package, comprising:
   a plurality of conductive outer leads having a first set of ends extending toward an interior of the package;
   a plurality of conductive inner leads, each of the inner leads electrically isolated from each other and from the outer leads, wherein each of the inner leads has at least a first and a second end, with at least the first end extending toward an exterior of the package;
   a first die coupled to a first side of the inner leads; and
   a second die coupled to an opposite second side of the inner leads.

8. The package of claim 7, wherein the second die has a first set of bond pads along the exterior of the second die and a second set of bond pads along the interior of the second die, and wherein the first and second set of bond pads are wire bonded to the inner leads.

9. A semiconductor die package, comprising:
   a first die;
   a plurality of outer lead fingers;
   a plurality of inner lead fingers, wherein the inner lead fingers are electrically isolated from each other and from the outer lead fingers and wherein the inner lead fingers have at least two exposed ends;
   means for securing the inner lead fingers;
   means for securing the first die to the inner lead fingers;

a second die, wherein the first die is electrically coupled to at least one of the outer lead fingers, or to the second die, through one of said inner lead figners; and means for coupling the second die over the first die.

10. The package of claim 9, wherein the means for securing the inner lead fingers comprises a non-conductive tape.

11. A semiconductor die package, comprising:

a plurality of outer lead frame fingers;

an inner paddle area comprising a plurality of inner lead frame fingers electrically isolated from each other and from any of said outer lead frame fingers;

a first die electrically coupled to the inner lead frame fingers of the inner paddle area; and a second die stacked with the first die in the inner paddle area and electrically coupled to the first die through at least one of the inner lead frame fingers.

12. The package of claim 11, further comprising a means for securing the inner lead frame fingers.

13. A semiconductor die package, comprising:

a plurality of outer lead frame fingers;

an inner paddle area comprising a plurality of inner lead frame fingers electrically isolated from each other;

a first die electrically coupled to the inner paddle area; and a second die electrically coupled to the first die through at least some of the inner lead frame fingers, wherein the first die is coupled to one side of the inner paddle area and the second die is coupled to an opposite side of the inner paddle area.

14. The semiconductor package of claim 1, wherein the first die is electrically coupled to the end of at least one of the outer leads and to the first end of at least one of the inner leads, the second die is electrically coupled to the first die through at least one of the inner leads, and the second die is electrically coupled to the end of at least one of the outer leads.

15. The package of claim 1, wherein at least one of the inner leads has a third end that extends toward the exterior of the package.

16. The package of claim 1, wherein a nonconductive layer couples the inner leads to each other, said nonconductive layer being located vertically between the inner leads and the first die.

17. The package of claim 1, wherein a nonconductive layer couples the inner leads to each other, and the inner leads are located vertically between the nonconductive layer and the first die.

18. The package of claim 1, wherein the first ends of the inner leads extend beyond and are interleaved with the ends of adjacent ones of the outer leads.

19. The semiconductor die package of claim 7, wherein the first die is electrically coupled to the second die through at least one of the inner leads.

20. The semiconductor package of claim 7, wherein the first die is electrically coupled to the end of at least one of the outer leads and to the first end of at least one of the inner leads, the second die is electrically coupled to the first die through at least one of the inner leads, and the second die is electrically coupled to the end of at least one of the outer leads.

21. The package of claim 7, wherein the first die and the second die each have a first surface with bond pads thereon and an opposite second surface, the second surface of the first die is coupled to the first side of the inner leads, and the second surface of the second die is coupled to the second side of the inner leads.

22. The semiconductor die package of claim 21, wherein the first die is electrically coupled to the second die through at least one of the inner leads.

23. The package of claim 7, wherein the first die and the second die each have a first surface with bond pads thereon, the first surface of the first die is coupled to the first side of the inner leads, and the first surface of the second die is coupled to the second side of the inner leads.

24. The package of claim 23, further comprising a means to electrically connect the first ends of at least two of the inner leads.

25. The package of claim 23, further comprising a means to electrically connect the second ends of at least two of the inner leads.

26. The package of claim 23, wherein at least some of the bond pads of the second die are centrally located on the first surface of the second die, and at least one of the centrally located bond pads is electrically coupled to a second end of one of the inner leads.

27. The package of claim 23, wherein at least some of the second ends are located over a central portion of the first surface of the second die.

28. The semiconductor die package of claim 7, wherein a nonconductive layer couples the inner leads to each other.

29. The package of claim 11, wherein the second die is coupled over the first die.

30. The package of claim 29, wherein a nonconductive layer couples the inner lead frame fingers to each other.

31. The package of claim 11, wherein the inner lead frame fingers are vertically between the first die and the second die.

32. The package of claim 31, wherein the second die includes bond pads on a first surface thereof, and the first surface faces and is coupled to the inner lead frame fingers.

33. The package of claim 32, wherein at least some of the bond pads of the second die are centrally located on the first surface of the second die, and are electrically connected by bond wires to inner lead frame fingers.

34. The package of claim 31, wherein the first and second die include bond pads on a respective first surface thereof, and the first surfaces of the first and second dies face away from the inner lead frame fingers.

35. The package of claim 13, wherein the first and second dies are each electrically coupled to at least some of the inner lead frame fingers and to at least some of the outer lead frame fingers.

36. The package of claim 11, further comprising a plastic encapsulant covering the first and second dies and the inner leads, and a thermal pad or a heat slug exposed out of said plastic encapsulant.

37. The package of claim 11, further comprising a plastic encapsulant covering the first and second dies, wherein the inner leads are completely within the plastic encapsulant.

38. The package of claim 37, wherein the inner leads are coupled together by a layer of a nonconductive tape.

39. The package of claim 7, wherein the second die has center bond pads at a central area of a surface of the second die, said bond pads being oriented toward the inner leads.

40. The package of claim 39, wherein at least one said center bond pad is electrically coupled to a second end at least of one of the inner leads under the first die.

41. The package of claim 23, wherein the first die is electrically coupled to the second die through at least one of the inner leads.

* * * * *